US007839183B2

(12) United States Patent
Kawakami

(10) Patent No.: US 7,839,183 B2
(45) Date of Patent: Nov. 23, 2010

(54) CIRCUIT FOR DISCRIMINATING OUTPUT OF SQUELCH CIRCUIT AND CIRCUIT FOR REGULATING SENSIVITY OF THE SAME

(75) Inventor: Shinya Kawakami, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 424 days.

(21) Appl. No.: 11/854,923

(22) Filed: Sep. 13, 2007

(65) Prior Publication Data

US 2008/0197886 A1   Aug. 21, 2008

(30) Foreign Application Priority Data

Sep. 13, 2006   (JP)   ............... 2006-248601

(51) Int. Cl.
   *H03K 5/22*   (2006.01)
(52) U.S. Cl. ......................................... 327/64; 375/376
(58) Field of Classification Search ............... 327/64, 327/376
   See application file for complete search history.

(56) References Cited

U.S. PATENT DOCUMENTS 5,436,934 A   7/1995   Co
5,446,921 A   8/1995   Tobler
6,081,572 A *   6/2000   Filip ........................ 375/373
6,486,710 B1   11/2002   Simoni
6,954,510 B2 *   10/2005   Lee ............................. 375/373

* cited by examiner

*Primary Examiner*—Lincoln Donovan
*Assistant Examiner*—John W Poos
(74) *Attorney, Agent, or Firm*—Turocy & Watson, LLP

(57) ABSTRACT

A circuit for discriminating a 'Noisy' state of an output of a squelch circuit is disclosed. A circuit for resolve the 'Noisy' state of the output of the squelch circuit is also disclosed which uses the output identification circuit. The output of the squelch circuit and a clear signal are input into a first AND gate. The output of the first AND gate is input into a first flip-flop. An inversed signal of the output of the first AND gate is input into a second flip-flop. The outputs of the first and second flip-flops are input into a discriminating unit including a second AND gate. The 'Noisy' state is identified by the output of the second AND gate. Based on the identification result, sensitivity of the squelch circuit is regulated.

11 Claims, 7 Drawing Sheets

FIG. 3

| | |
|---|---|
| OUTPUT Vout of SQUELCH CIRCUIT 100 | ─────────'Low'───────────── |
| CLEAR COMMAND SIGNAL | ────┘⎺⎺⎺⎺⎺⎺⎺⎺⎺⎺⎺ |
| CLOCK SIGNAL OF FLIP-FLOP 11 | ─────────────────── |
| CLOCK SIGNAL OF FLIP-FLOP 12 | ─────────────────── |
| OUTPUT OUT0 OF FLIP-FLOP 11 | ─────────────────── |
| OUTPUT OUT1 OF FLIP-FLOP 12 | ─────────────────── |
| 'High' IDENTIFICATION SIGNAL OF DISCRIMINATING UNIT 13 | ─────────────────── |
| 'Low' IDENTIFICATION SIGNAL OF DISCRIMINATING UNIT 13 | ────┘⎺⎺⎺⎺⎺⎺⎺⎺⎺⎺ |
| 'Noisy' IDENTIFICATION SIGNAL OF DISCRIMINATING UNIT 13 | ─────────────────── |

CIRCUIT FOR DISCRIMINATING OUTPUT OF SQUELCH CIRCUIT AND CIRCUIT FOR REGULATING SENSIVITY OF THE SAME

CROSS REFERENCE TO RELATED APPLICATION

This application is based upon and claims the benefit of priority from the prior Japanese Patent Application No. 2006-248601, filed on Sep. 13, 2006, the entire contents of which are incorporated herein by reference.

FIELD OF THE INVENTION

This invention relates to a circuit for discriminating an output of a squelch circuit and to a circuit for regulating sensitivity of the squelch circuit.

DESCRIPTION OF THE BACKGROUND

USB (Universal Serial Bus) 2.0 is a data communication standard between a personal computer and a peripheral equipment. The USB 2.0 is capable of data transferring at 480 Mbps at the maximum as. In recent years, the USB 2.0 standard has been widely used.

According to the USB 2.0 standard, it is necessary to install a squelch circuit in a personal computer and a peripheral equipment. The squelch circuit judges whether receipt of a transferred data is to be approved or blocked according to a voltage difference between differential input voltages Vin1 and Vin2 received in the personal computer or the peripheral equipment.

When a voltage difference between differential input voltages Vin1 and Vin2 is above predetermined voltage Vhi, the squelch circuit is set non-active and outputs a 'Low' level signal to approve receipt of the transferred data. On the other hand, when a voltage difference between differential input voltages Vin1 and Vin2 is below pre predetermined voltage Vlo, the squelch circuit is set active and outputs a 'High' level signal to block receipt of the transferred data. The relation between the predetermined voltages Vhi and Vlo is expressed as Vhi>Vlo.

However, when a voltage difference between differential input voltages Vin1 and Vin2 is larger than Vlo and less than Vhi, an output of the squelch circuit vibrates between the 'High' level and the 'Low' level to show a 'Noisy' level signal.

In order to evaluate operating characteristics of the squelch circuit, the voltage difference between the differential input voltages Vin1 and Vin2 is usually measured by sampling an output level of the squelch circuit to approve or block receipt of the transferred data, instead of measuring the differential input voltages Vin1 and Vin2

When the output of the squelch circuit is in the 'Noisy' state, the output may be judged as the 'High' level or the 'Low' level depending on timing of the sampling. Therefore, there is a problem that it is difficult to identify the 'Noisy' state of the output of the squelch circuit.

Further, when data receiving operation is controlled by such an output of the squelch circuit, a problem may occur that the data receiving state becomes unstable.

An improved squelch circuit is disclosed on Page 7 and in FIG. 6 of the Japanese Patent Application Publication (Kokai) No. 2005-354290. The publication shows that the squelch circuit is provided with a delay circuit to realize a filtering function to remove the 'Noisy' state, that is, a hazard.

However, the delay circuit described above determines the delay time by an analog operation of charging/discharging of a MOS capacitance formed in an LSI.

Thus, there is a problem that filtering characteristics of the delay circuit change due to fluctuation of characteristics in manufacturing the LSI.

SUMMARY OF THE INVENTION

According to an aspect of the invention, a circuit for discriminating an output of a squelch circuit is provided, which comprises a first flip-flop circuit outputting an first output, the first output being set to a initial level by a clear command signal and being changed to an inverse level of the initial level in one case of when the output of the squelch circuit is in a 'High' level and when the output of the squelch circuit rises to the 'High' level from a 'Low' level after the clear command signal is canceled, a second flip-flop circuit outputting an second output, the second output being set to a initial level by a clear command signal and being changed to an inverse level of the initial level when the output the squelch circuit is lowered to a 'Low' level from the 'High' level after the clear command signal is canceled, and a discriminating unit configured to discriminate an output state of the squelch circuit based on the levels of the first output of the first flip-flop circuit and the second output of the second flip-flop circuit after the cancellation of the clear command signal.

According to another aspect of the invention, a circuit for regulating sensitivity an output of a squelch circuit is provided, which comprises a clear command signal generating unit to output a clear command signal periodically, an output discriminating circuit having a first flip-flop circuit outputting an first output, the first output being set to a initial level by the clear command signal and being changed to an inverse level of the initial level in one case of when the output of the squelch circuit is in a 'High' level and when the output of the squelch circuit rises to the 'High' level from a 'Low' level after the clear command signal is canceled, a second flip-flop circuit outputting an second output, the second output being set to a initial level by a clear command signal and being changed to an inverse level of the initial level when the output the squelch circuit is lowered to a 'Low' level from the 'High' level after the clear command signal is canceled, and a discriminating unit configured to identify that an output state of the squelch circuit is at a 'Noisy' state based on the levels of the first output of the first flip-flop circuit and the second output of the second flip-flop circuit after the cancellation of the clear command signal, and a sensitivity regulating unit configured to output a sensitivity regulating signal to regulate the sensitivity of the squelch circuit when the output discriminating circuit identifies that the output of the squelch circuit is at the 'Noisy' state.

BRIEF DESCRIPTION OF THE DRAWINGS

FIG. 3 is a waveform diagram showing another example of operation of the embodiment of the circuit for discriminating the output of the squelch circuit according to the invention.

DETAILED DESCRIPTION OF THE INVENTION

Hereinafter, embodiments of the invention will be described with reference to the drawings.

Figure 1:
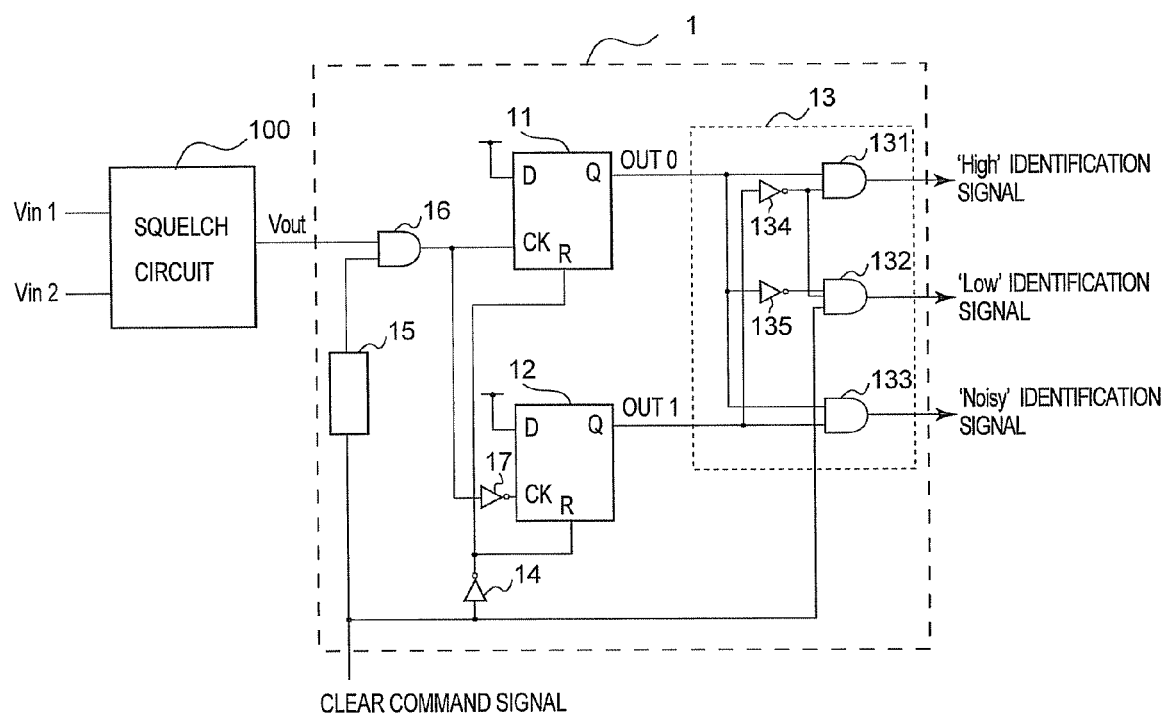
FIG. 1 is a circuit diagram showing an embodiment of a circuit for discriminating an output of a squelch circuit according to the invention.

FIG. 1 is a circuit diagram showing a structure of an embodiment of the output discriminating circuit of the squelch circuit according to the invention.

In FIG. 1, an output discriminating circuit 1 is shown. The output discriminating circuit is a circuit to discriminate an output state of an output signal Vout of a squelch circuit 100.

Figure 7:
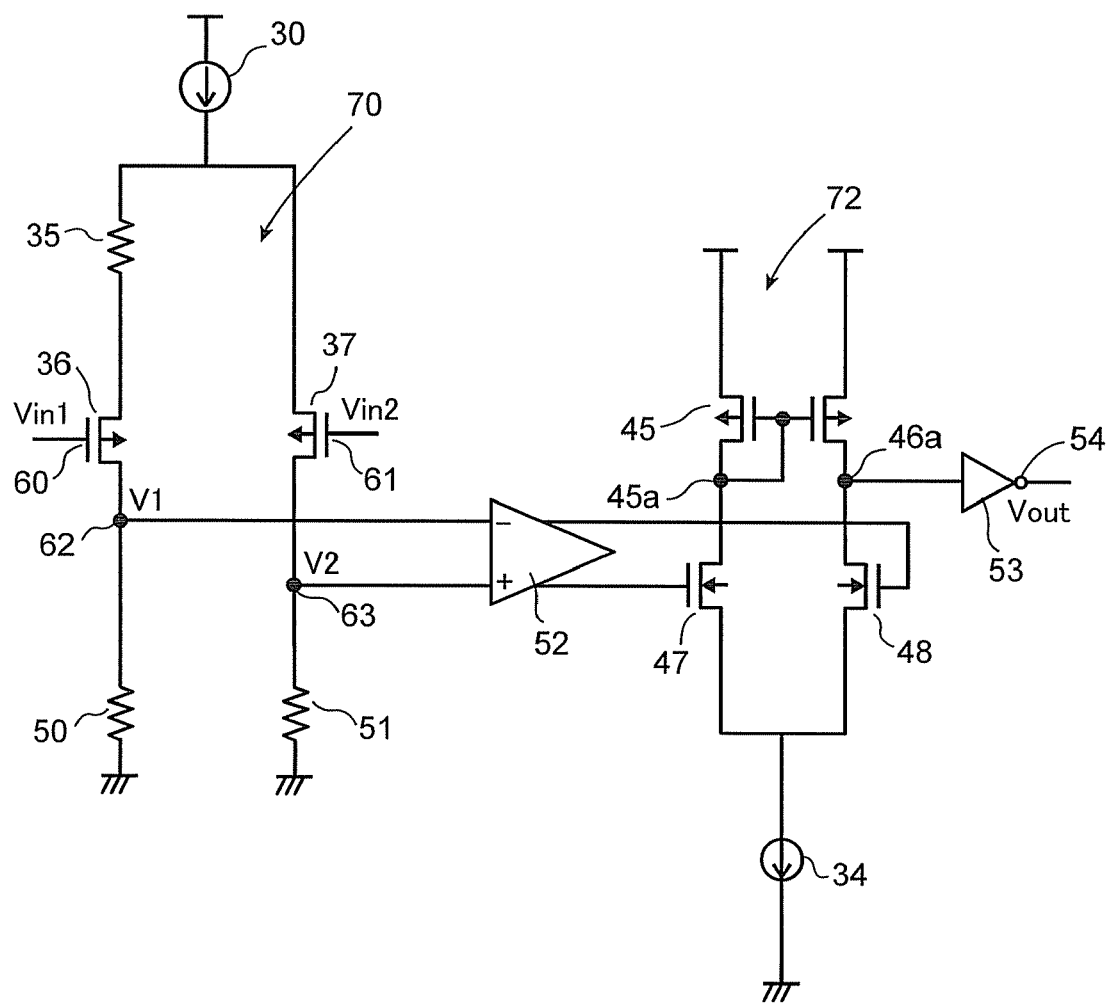
FIG. 7 is an example of a fundamental structure of the squelch circuit shown in FIGS. 1 and 5.

The squelch circuit 100 has a fundamental structure as shown in FIG. 7. The squelch circuit 100 includes current sources 30 and 34, MOS transistors 36, 37 and 45-48 and resistor 35, 50 and 51. The resistor 35 is an OFF set resistor. The resistor 35 and the MOS transistors 36, 37 and resistor 50 and 51 constitute a differential amplifier circuit 70. The MOS transistors 45 to 48 constitute a differential amplifier circuit 72. The differential amplifier circuit 70 and the differential amplifier circuit 72 have output terminals 62, 63, 45a and 46a.

Differential input voltages Vin1, Vin2 are provided to gates 60, 61 of the MOS transistors 36, 37 respectively, to obtain differential output voltages V1, V2 from terminals 62, 63. The differential output voltages V1, V2 are provided to an operational amplifier circuit 52. The outputs of the operational amplifier circuit 52 are provided to the MOS transistors 47, 48. The output from the output terminal 46a of the differential amplifier circuit 72 is provided to an inverter 53. As a result, an output Vout the squelch circuit 100 is obtained from an output terminal 54 of the inverter 53.

The output Vout of the squelch circuit 100 is a 'Low' level when a voltage difference between differential input voltages Vin1 and Vin2 received is above a predetermined voltage Vhi. Further, the output Vout of the squelch circuit 100 is a 'High' level when the voltage difference is below a predetermined voltage Vlo. When the voltage difference between the differential input voltages Vin1 and Vin2 is larger than Vlo but smaller than Vhi, the output Vout of the squelch circuit 100 becomes a 'Noisy' state. When the output Vout of the squelch circuit 100 is in a 'Noisy' state, the output Vout oscillates between the 'High' level and the 'Low' level.

The output discriminating circuit 1 is provided with a flip-flop 11 as a first flip-flop circuit, a flip-flop 12 as a second flip-flop circuit, an inverter 17 as a first inverter, an inverter 14 as a second inverter, and a discriminating unit 13.

The flip-flop 11 and the flip-flop 12 are a D-type flip-flop with a reset input terminal R, an input terminal D, a clock input terminal CK and an output terminal Q respectively. A clear command signal is provided to an inverter 14. An inverted signal obtained from the inverter 14 is input to the reset terminals R. When the clear command signal is '0', that is, when 'clear' is commanded, the outputs OUT0 and OUT1 of the flip-flops 11 and 12 are set at an initial level '0'. The input terminals D are connected to a supply voltage terminals that an inverted level '1' of the initial level '0' is always applied.

The clear command signal is delayed by a delay unit 15 so that the initial states of the flip-flops 11, 12 may be stabilized. The delayed clear command signal is input to the AND gate 16 as the first AND gate. The output Vout from the squelch circuit 100 is input to the AND gate 16. The output from the AND gate 16 is input to the clock input terminal CK of the flip-flop 11. Accordingly, the output OUT0 from the output terminal Q of the flip-flop 11 becomes '1' when the output of the AND gate 16 risen to '1' from '0' after the clear command is canceled, i.e., after the clear command signal changes to '1' from '0'.

The output OUT0 of the flip-flop 11 changes to the inversed level '1' of the initial level '0', when the clear command signal is changed to the cancellation level while the output Vout of the squelch circuit 100 is at the 'High' level, or when the output Vout of the squelch circuit 100 changes from the 'Low' level to the 'High' level after the clear command is canceled in the clear command signal, while the output Vout of the squelch circuit 100 is in the 'Noisy' state.

On the other hand, the flip-flop 12 is provided with an input terminal D, a reset terminal R, a clock input terminal CK and an output terminal Q. The output of the AND gate 16A is inverted by a inverter 17. The inverted signal is input to the clock input terminal CK of the flip-flop 12. Accordingly, the flip-flop 12 outputs an inversed level '1' of the initial level '0' as the output OUT1 from the output terminal Q of the flip-flop 12, when the output of the AND gate 16 falls to '0' from '1' after the clear command is canceled in the clear command signal.

The output OUT0 of the flip-flop 12 changes to '1', when the output Vout of the squelch circuit 100 changes from the 'High' level to the 'Low' level after the clear command is canceled in the clear command signal while the output Vout of the squelch circuit 100 is in the 'Noisy' state.

The discrimination unit 13 is provided with an AND gate 133 as a second AND gate, an AND gate 131 as a third AND gate, and an AND gate 132 as a fourth AND gate. Further, the discrimination unit 13 is also provided with an inverter 135 as a third inverter and an inverter 134 as a fourth inverter.

The output OUT0 of the flip-flop 11 and an inverted signal of the output OUT1 of the flip-flop 12 inverted by the inverter 134 are input to the AND gate 131, so that a 'High' identification signal is output from the AND gate 131. The 'High' identification signal becomes '1' in the case the output Vout of the squelch circuit 100 is at the 'High' level when the clear command is canceled in the clear command signal.

The output OUT0 of the flip-flop 11 is inverted by the inverter 135. The output OUT1 of the flip-flop 12 is inverted by the inverter 134. The inverted signal of the output OUT0, the inverted signal of the output OUT1 and the clear command signal are input to the AND gate 132 so that a 'Low' identification signal is output from the AND gate 132. The 'Low' identification signal becomes '1' in the case the output Vout of the squelch circuit 100 is at the 'Low' level when the clear command is canceled in the clear command signal.

The output OUT0 of the flip-flop 11 and the output OUT1 of the flip-flop 12 are input to the AND gate 133 so that a 'Noisy' identification signal is output from the AND gate 133. The 'Noisy' identification signal becomes '1' in the case the output Vout of the squelch circuit 100 is in a 'Noisy' state when the clear command is canceled in the clear command signal. In order to identifying the 'Noisy' state, the AND gate 131, the AND gate 132, the inverter 134 and the inverter 135 can be omitted.

It is possible to identify whether the output Vout of the squelch circuit 100 is at the 'High' level, at the 'Low' level or in the 'Noisy' state, respectively by that the 'High' identification signal, the 'Low' identification signal or the 'Noisy' identification signal indicates '1'.

The operation of the output discriminating circuit 1 will be described using the waveform diagrams shown in FIGS. 2 to 4.

Figure 2:
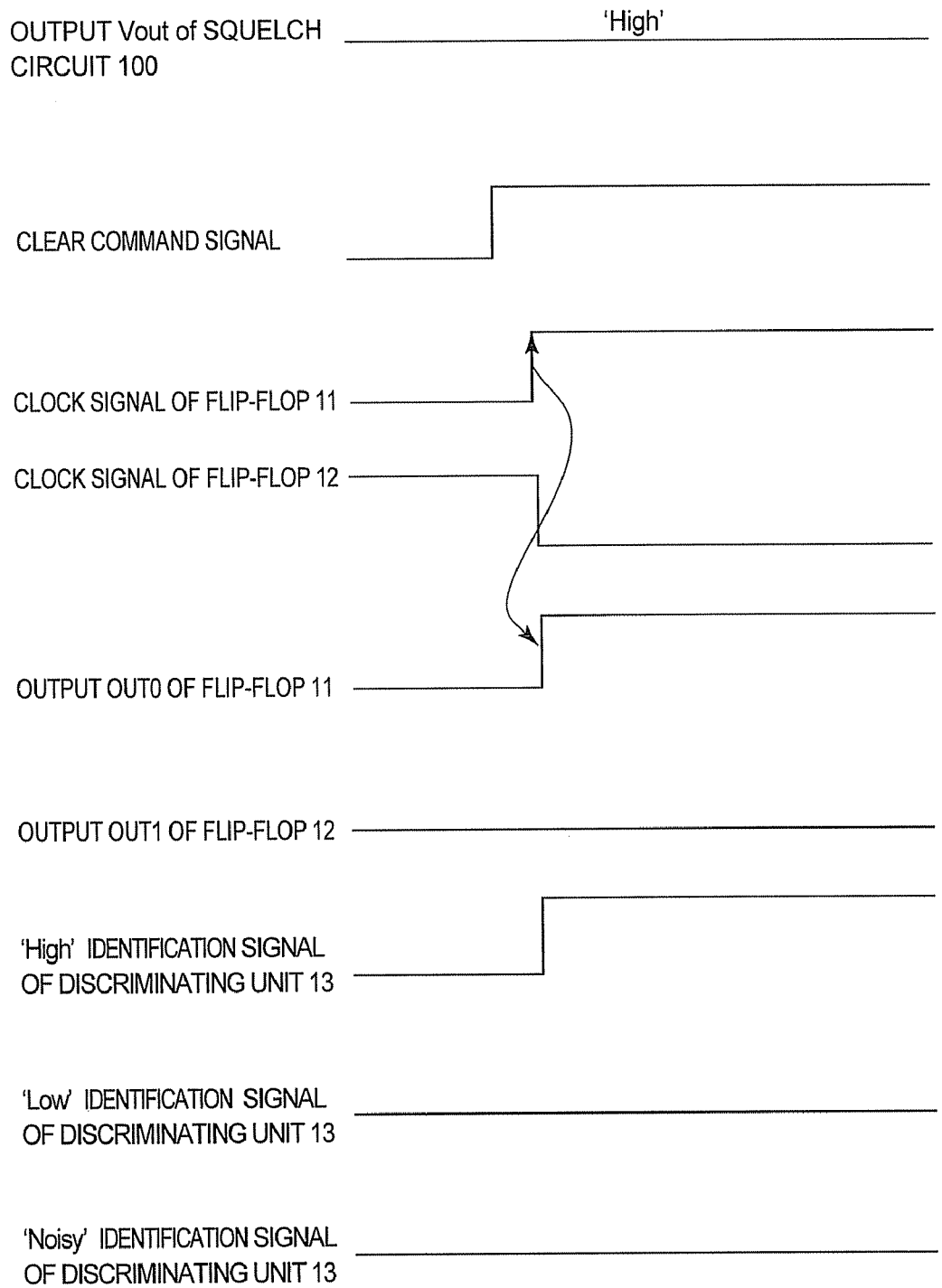
FIG. 2 is a waveform diagram showing an example of operation of the embodiment of the circuit for discriminating the output of the squelch circuit according to the invention.

FIG. 2 is a waveform diagram showing an example of operation of the output discriminating circuit 1 at the time when the output Vout of the squelch circuit 100 is at the 'High' level.

The output of the AND gate 16 rises from '0' to '1' When the clear command signal rises to '1' from '0' while the output Vout of the squelch circuit is at the 'High' level. The input to the clock input terminal CK of the flip-flop 11 rises to '1' from '0'.

As a result, the output OUT0 of the flip-flop 11 changes to '1' from the initial state '0'.

On the other hand, the input to the clock input terminal CK of the flip-flop 12 is a signal obtained by inverting the output of the AND gate 16 by the inverter 17. Accordingly, the output OUT1 of the flip-flop 12 remains unchanged at the initial state '0' as the input to the clock input terminal CK of the flip-flop 12 only falls from '1' to '0'.

Only the 'High' identification signal, that is the output of the AND gate 131 of the discriminating unit 13, changes from '0' to '1'. As a result, the output discriminating circuit 1 identifies that the output Vout of the squelch circuit 100 is at the 'High' level.

FIG. 3 is a waveform diagram showing another example of operation of the output discriminating circuit 1 at the time when the output Vout of the squelch circuit is at the 'Low' level.

When the output Vout of the squelch circuit 100 is at the 'Low' level, the output of the AND gate 16 remains unchanged at '0'. Therefore, the input to the clock input terminal CK of the flip-flop 11 remains at '0', and the input to the clock input terminal CK of the flip-flop 12 remains at '1,' so that the output OUT0 of the flip-flop 11 and the output OUT1 of the flip-flop 12 remain at the initial state '0'.

In this case, only the 'Low' identification signal that is the output of the AND gate 132 of the discriminating unit 13 changes to '1' from '0' in response to rising of the clear command signal. The output discrimination circuit 1 identifies that the output Vout of the squelch circuit 100 is at the 'Low' level.

Figure 4:
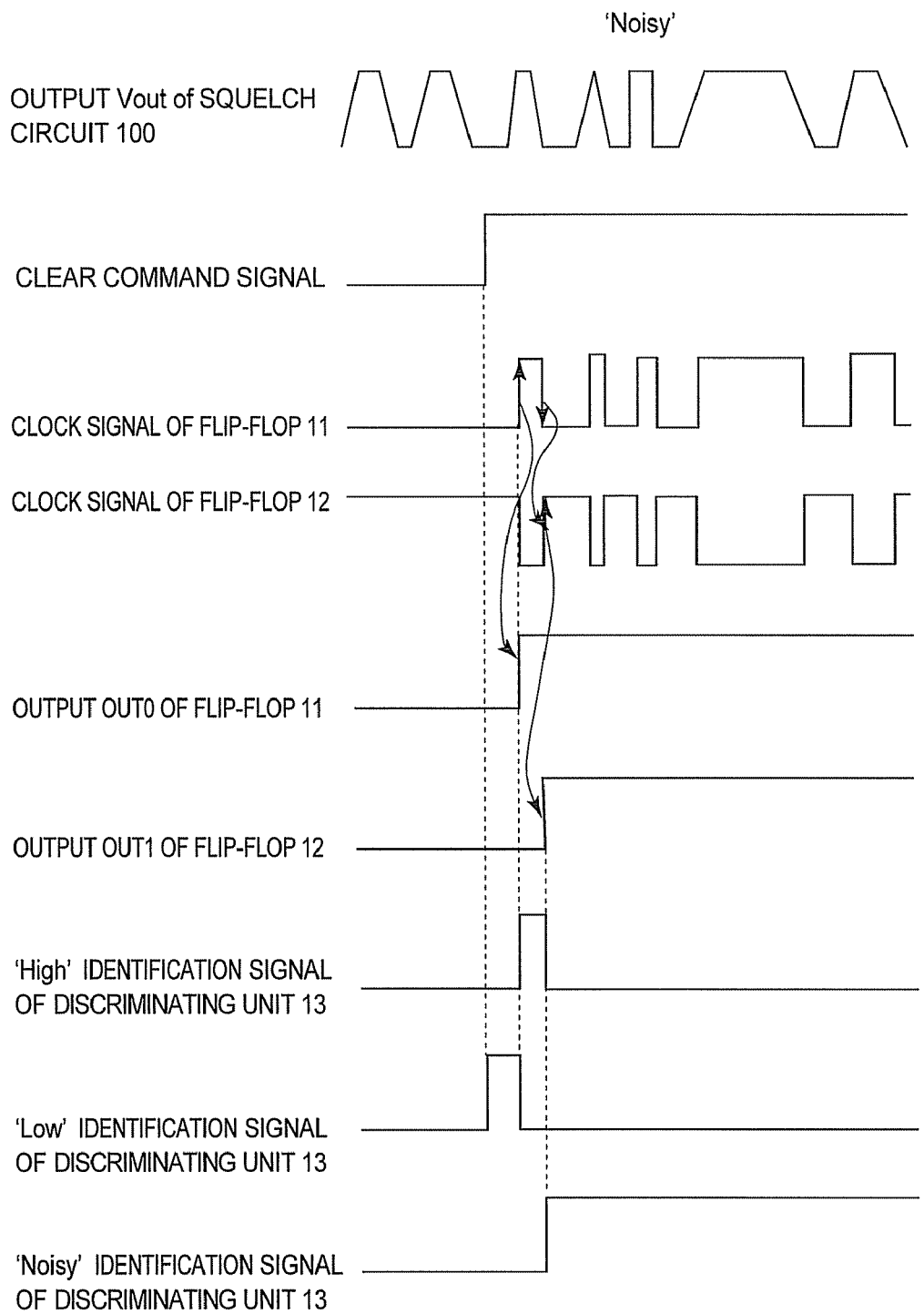
FIG. 4 is a waveform diagram showing further another example of operation of the embodiment of the circuit for discriminating the output of the squelch circuit according to the invention.

FIG. 4 is a waveform diagram showing further another example of operation of the output discriminating circuit 1 at the time when the output Vout of the squelch circuit 100 is in the 'Noisy' state.

The output Vout of the squelch circuit 100 is in the 'Noisy' state. The input to the clock input terminal CK of the flip-flop 11 rises to '1' from '0', when the output Vout of the squelch circuit 100 changes to the 'High' level from the 'Low' level while the clear state is canceled and a normal state is set to be at '1' in the clear command signal. As a result, the output OUT0 of the flip-flop 11 changes to '1' from the initial state '0'.

After the above stage, the input to the clock input terminal CK of the flip-flop 12 rises to '1' from '0', when the output Vout of the squelch circuit 100 changes from the 'High' level to the 'Low' level. As a result, the output OUT1 of the flip-flop 12 changes to '1' from the initial state '0'.

The 'Low' identification signal and the 'High' identification signal respectively output from the discriminating unit 13 change to '1' as a pulse, after the clear command signal rises.

After the stages the 'Noisy' identification signal, that is the output of the AND gate 133 of the discriminating unit 13 becomes '1' stably. As a result, the output discriminating circuit 1 identifies that the output Vout of the squelch circuit 100 is in the 'Noisy' state.

According to the embodiment, by observing which one of the 'High' identification signal, the 'Low' identification signal and the 'Noisy' identification signal, it is possible to identify whether the output of the squelch circuit 100 is at the 'high' level, the 'Low' level or the 'Noisy' state. Thus, the operating characteristics of the squelch circuit 100 can be evaluated precisely.

Figure 5:
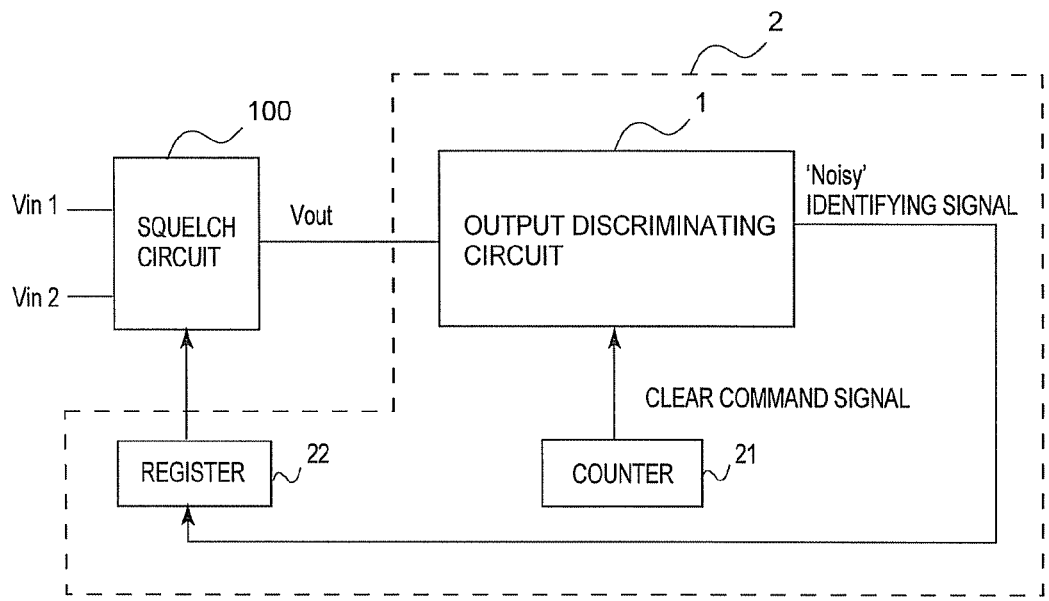
FIG. 5 is a circuit diagram showing an embodiment of a circuit for regulating sensitivity of a squelch circuit according to the invention, using the embodiment of the circuit for discriminating the output of the squelch circuit shown in FIG. 1.

FIG. 5 is a circuit diagram showing an embodiment of a sensitivity regulating circuit of a squelch circuit according the invention. The circuit of FIG. 5 employs the output discriminating circuit shown in FIG. 1.

The sensitivity regulating circuit is configured to regulate the sensitivity of the squelch circuit 100 so as to resolve the 'Noisy' state of the output of the squelch circuit 100 when the output of the squelch circuit 100 is identified as being in the 'Noisy' state by the output discriminating circuit.

Figure 8:
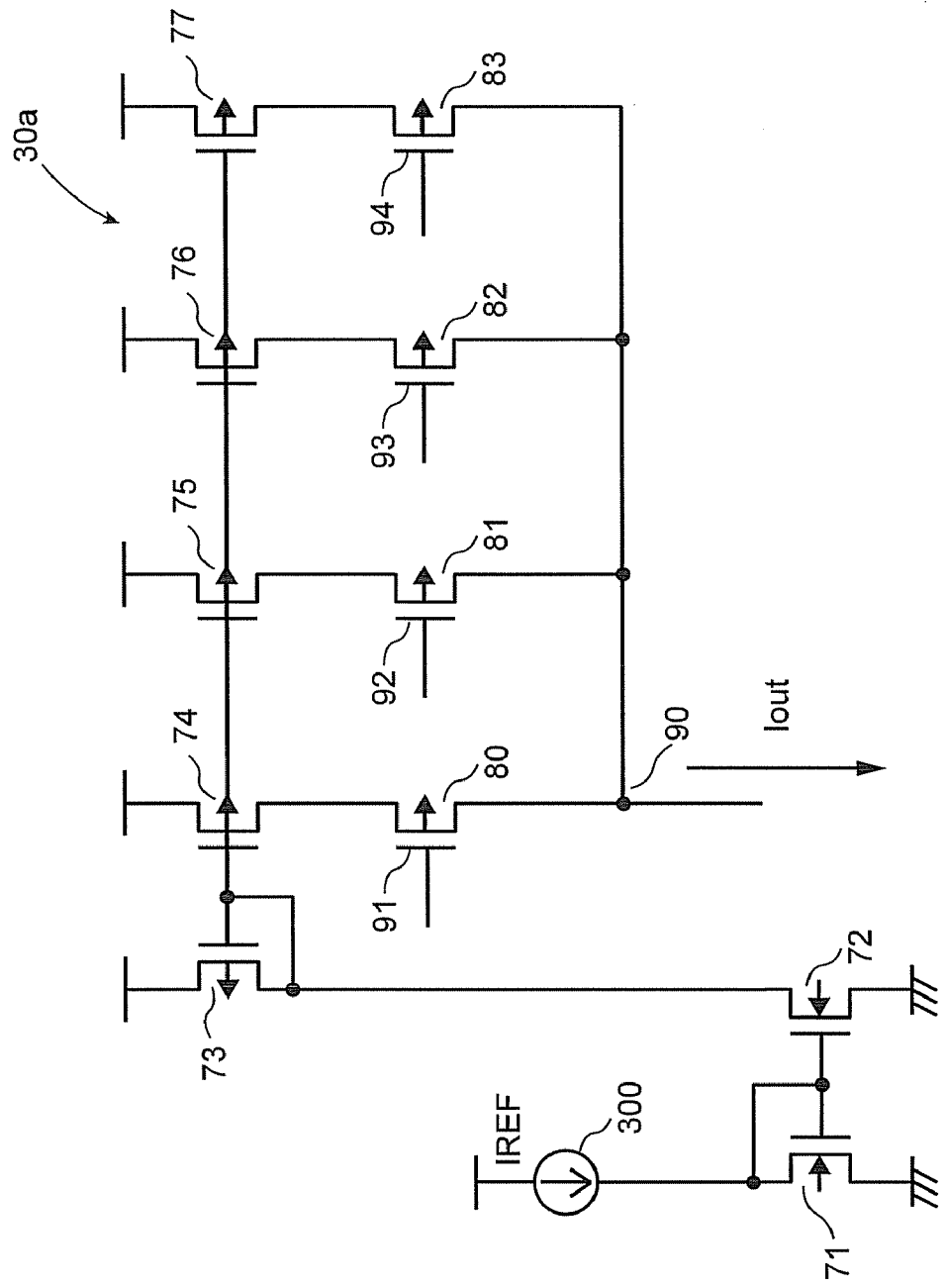
FIG. 8 is a circuit diagram showing an example of a current generating circuit.

In order to regulate sensitivity of the squelch circuit 100, the current source 30, which supplies a first-stage current of the squelch circuit 100, has a structure of a current generating circuit 30a shown in FIG. 8, for example. The current generating circuit 30a is a current mirror circuit including current source 300 and MOS transistors 71 to 77 and 80 to 83. The MOS transistors 80 to 83 are switching transistors. A summed output current Iout is obtained from an output terminal 90. The summed output current Iout may be changed by switching ON/OFF state of each of the transistors 80 to 83 selectively. The relation between signals given to gates 91 to 94 of the MOS transistors 80 to 83 and a current value of the summed output current Iout will be described later.

The sensitivity regulating circuit 2 includes the output discriminating circuit 1, a counter 21 to output the clear command signal to the output discriminating circuit 1 and a register 22 storing a plural number of sensitivity regulating values that are to be given to the squelch circuit 100.

The output discriminating circuit 1 is a circuit shown in FIG. 1. The output discriminating circuit 1 outputs '1' as the 'Noisy' identification signal when the output Vout of the squelch circuit 100 is in the 'Noisy' state.

The counter 21 counts a predetermined number repeatedly. The counter 21 outputs the clear command signal each time when a count value reaches the predetermined number. The counter 21 outputs the clear command signal to the output discriminating circuit 1 at a cycle of a predetermined number as an interval.

When the clear command signal is input, the output discriminating circuit 1 is set at the initial level and identifies the output state of the squelch circuit 100 each time when the clear command is canceled. Therefore, the frequency of identification of the output discriminating circuit 1 can be changed by changing the predetermined count number of the counter 21.

The register 22 stores a plural number of sensitive regulating values that are different in steps. The sensitive regulating values are a binary code of four bits. The binary code is output from the register 22. The binary code changes each time '1' is output as the 'Noisy' identification signal of the output discriminating circuit 1. The register 22 provides code data of four bits respectively figure by figure to the gates 91 to 94 of the MOS transistors 80 to 83 in the current generating circuit 30a of FIG. 8, which is employed as the current source 30 of the squelch circuit 100.

When '1' is given as a number of an figure of the binary code, an ON signal is input to a corresponding one of the MOS transistors 80 to 83 to render the MOS transistor in an ON state.

When '0' is given as a number of an figure of the binary code, an OFF signal is input to a corresponding one of the MOS transistors 80 to 83 to render the MOS transistor in an OFF state.

When (0001) is given as the binary code, the summed output current Iout of the current generating circuit 30*a* is 100 μA. When (0010) is given as the binary code, the summed output current Iout of the current generating circuit 30*a* is 90 μA. When (0011) is given as the binary code, the summed output current Iout of the current generating circuit 30*a* is 80 μA.

Upon receipt of the sensitivity regulating signals, the squelch circuit 100 changes its sensitivity so that the output changes from the 'Noisy' state to the 'Low' level. Here, the sensitivity is regulated so as to change the 'Noisy' state to the 'Low' level, because the 'Noisy' state may be regarded as the 'Low' state from the viewpoint of the circuit structure of the USB 2.0.

The operation of the sensitivity regulating circuit 2 will be described using the waveform diagram shown in FIG. 6.

Figure 6:
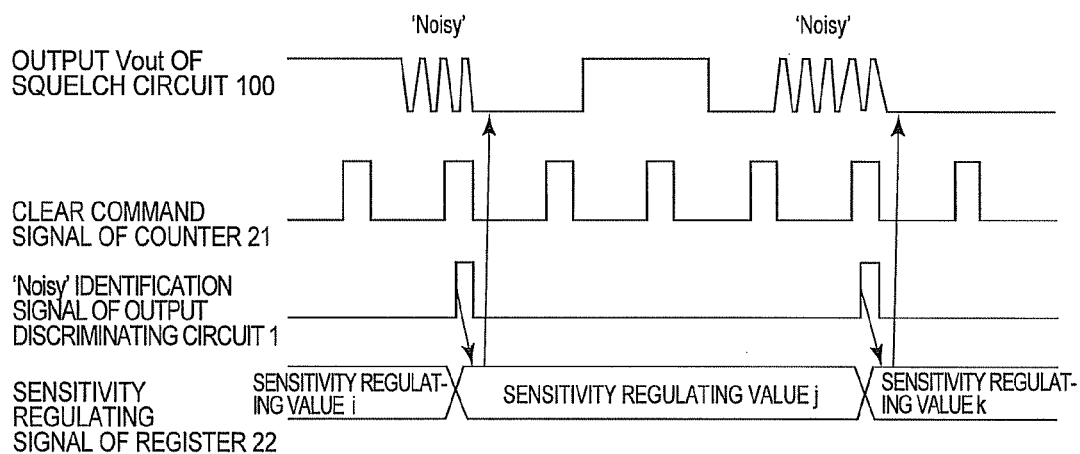
FIG. 6 is a waveform diagram showing an example of operation of the circuit for regulating sensitivity of the squelch circuit shown in FIG. 5.

In FIG. 6, it is assumed that a binary code (0001), as a sensitivity regulating value i, has read out from the register 22 as the sensitivity regulating signal so that the squelch circuit 100 operate at the sensitivity corresponding to the read out sensitivity regulating value i.

For this squelch circuit 100, the output discriminating circuit 1 identifies the output state of the output Vout of the squelch circuit 100 every time when the clear command in the clear command signal being output cyclically from the counter 21 is canceled. Then, the output discriminating circuit 1 outputs '1' as the 'Noisy' identification signal when the output Vout of the squelch circuit 100 becomes in the 'Noisy' state.

When the 'Noisy' identification signal being output from the output discriminating circuit 1 becomes '1', the value read out from the register 22 changes to a binary code (0010) as a sensitivity regulating value j. The binary code (0010) is given to the squelch circuit 100 as a new sensitivity regulating signal.

The sensitivity of the squelch circuit 100 is changed by one step by the sensitivity regulating value j so that the output Vout of the squelch circuit 100 becomes at the 'Low' level.

After the stage, when the output Vout of the squelch circuit 100 becomes the 'Noisy' state again, '1' is output as the 'Noisy' identification signal of the output discriminating circuit 1 so that a binary code (0011) as a sensitivity regulating value k, is read out from the register 22.

When the sensitivity regulating value k is given to the squelch circuit 100, the sensitivity of the squelch circuit 100 is changed by one more step so that the output Vout of the squelch circuit 100 becomes the 'Low' level.

Since the sensitivity of the squelch circuit 100 is regulated by the sensitivity regulating circuit 2, the output characteristics of the squelch circuit 100 can be prevented from being changed by characteristic fluctuation in the manufacturing of LSI. Thus, the output characteristics of the squelch circuit 100 can be stabilized by the sensitivity regulating circuit 2.

The invention is not restricted to the embodiments described above but can be variously modified and implemented without departing from the spirit and the scope of the invention.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A circuit for regulating sensitivity an output of a squelch circuit, comprising:
   a clear command signal generating unit to output a clear command signal periodically;
   an output discriminating circuit having a first flip-flop circuit outputting an first output, a second flip-flop circuit outputting an second output and a discriminating unit,
   the first flip-flop circuit to receive a signal based on the output of the squelch circuit and to output a first output, the first output being set to a initial level by the clear command signal and being changed to an inverse level of the initial level in one case of when the output of the squelch circuit is in a 'High' level and when the output of the squelch circuit rises to the 'High' level from a 'Low' level after the clear command signal is canceled,
   a second flip-flop circuit to receive a signal based on the output of the squelch circuit and to output a second output, the second output being set to a initial level by the clear command signal and being changed to an inverse level of the initial level when the output the squelch circuit is lowered to a 'Low' level from the 'High' level after the clear command signal is canceled, and
   the discriminating unit being configured to identify that an output state of the squelch circuit is at a 'Noisy' state based on the levels of the first output of the first flip-flop circuit and the second output of the second flip-flop circuit after the cancellation of the clear command signal; and
   a sensitivity regulating unit configured to output a sensitivity regulating signal to regulate the sensitivity of the squelch circuit when the output discriminating circuit identifies that the output of the squelch circuit is at the 'Noisy' state,
   wherein the clear command signal generating unit is provided with a counter to count a predetermined number repeatedly, the counter outputting the clear command signal each time the counted value reaches the predetermined number.

2. A circuit for regulating sensitivity an output of a squelch circuit, comprising:
   a clear command signal generating unit to output a clear command signal periodically;
   an output discriminating circuit having a first flip-flop circuit outputting an first output, a second flip-flop circuit outputting an second output and a discriminating unit,
   the first flip-flop circuit to receive a signal based on the output of the squelch circuit and to output a first output, the first output being set to a initial level by the clear command signal and being changed to an inverse level of the initial level in one case of when the output of the squelch circuit is in a 'High' level and when the output of the squelch circuit rises to the 'High' level from a 'Low' level after the clear command signal is canceled,
   a second flip-flop circuit to receive a signal based on the output of the squelch circuit and to output a second output, the second output being set to a initial level by the clear command signal and being changed to an inverse level of the initial level when the output the squelch circuit is lowered to a 'Low' level from the 'High' level after the clear command signal is canceled, and the discriminating unit being configured to identify that an output state of the squelch circuit is at a 'Noisy' state based on the levels of the first output of the first flip-flop circuit and the second output of the second flip-flop circuit after the cancellation of the clear command signal; and a sensitivity regulating unit configured to output a sensitivity regulating signal to regulate the sensitivity of the squelch circuit when the output discriminating circuit identifies that the output of the squelch circuit is at the 'Noisy' state, wherein the discriminating unit identifies that the output of the squelch circuit is at a 'Noisy' state when both the first output of the first flip-flop circuit and the second output of the second flip-flop circuit are at the inverse level, the discriminating unit outputs a signal showing that the output of the squelch circuit is at a 'Noisy' state, and the clear command signal generating unit is provided with a counter to count a predetermined number repeatedly, the counter outputting the clear command signal each time the counted value reaches the predetermined number.

3. A circuit for regulating sensitivity an output of a squelch circuit, comprising:

a clear command signal generating unit to output a clear command signal periodically;

an output discriminating circuit having a first flip-flop circuit outputting an first output, a second flip-flop circuit outputting an second output and a discriminating unit, the first flip-flop circuit to receive a signal based on the output of the squelch circuit and to output a first output, the first output being set to a initial level by the clear command signal and being changed to an inverse level of the initial level in one case of when the output of the squelch circuit is in a 'High' level and when the output of the squelch circuit rises to the 'High' level from a 'Low' level after the clear command signal is canceled, a second flip-flop circuit to receive a signal based on the output of the squelch circuit and to output a second output, the second output being set to a initial level by the clear command signal and being changed to an inverse level of the initial level when the output the squelch circuit is lowered to a 'Low' level from the 'High' level after the clear command signal is canceled, and the discriminating unit being configured to identify that an output state of the squelch circuit is at a 'Noisy' state based on the levels of the first output of the first flip-flop circuit and the second output of the second flip-flop circuit after the cancellation of the clear command signal; and a sensitivity regulating unit configured to output a sensitivity regulating signal to regulate the sensitivity of the squelch circuit when the output discriminating circuit identifies that the output of the squelch circuit is at the 'Noisy' state, wherein the discriminating unit identifies in a way that the output of the squelch circuit is at the 'High' level state when the first output of the first flip-flop circuit is at the inverse level and when the second output of the second flip-flop circuit is at the initial level, that the output of the squelch circuit is at the 'Low' level state when the first output of the first flip-flop circuit is at the initial level and the second output of the second flip-flop circuit is at the initial level, and that the output of the squelch circuit is at the 'Noisy' state when the first output of the first flip-flop is at the inverse level and the second output of the second flip-flop is at the inverse level; and the clear command signal generating unit is provided with a counter to count a predetermined number repeatedly, the counter outputting the clear command signal each time the counted value reaches the predetermined number.

4. The circuit for regulating sensitivity an output of a squelch circuit, comprising:

a clear command signal generating unit to output a clear command signal periodically;

a first AND gate to receive the output of the squelch circuit and the clear command signal;

a first inverter to inverse the output of the AND gate;

a second inverter to invert the clear signal;

a first flip-flop circuit having a clock input terminal to receive the output of the first AND gate and having a reset input terminal to receive the output of the second inverter;

a second flip-flop circuit having a clock input terminal to receive the output of the first inverter and having a reset input terminal to receive the output of the second inverter;

a second AND gate to receive a first output of the first flip-flop circuit and a second output of the second flip-flop circuit; and a sensitivity regulating unit configured to regulate the sensitivity of the squelch circuit when the output of the squelch circuit is identified as in a 'Noisy' state by the output of the second AND gate.

5. The circuit for regulating sensitivity an output of a squelch circuit according to claim 4, further comprising:

a third inverter to invert the first output of the first flip-flop circuit;

a fourth inverter to invert the second output of the second flip-flop circuit;

a third AND gate to receive the first output of the first flip-flop circuit and the output signal of the fourth inverter; and a fourth AND gate to receive the output of the third inverter, the output of the fourth inverter and the clear command signal, wherein a 'High' level state and a 'Low' level state of the output of the squelch circuit are identified by the third AND gate and the fourth AND gate.

6. The circuit for regulating sensitivity an output of a squelch circuit according to claim 4, wherein the clear command signal is input into the second AND gate through a delay unit.

7. The circuit for regulating sensitivity an output of a squelch circuit according to claim 5, wherein the clear command signal is input into the second AND gate through a delay unit.

8. The circuit for regulating sensitivity an output of a squelch circuit according to claim 4, further comprising:

a counter to count a predetermined number repeatedly, the counter outputting the clear command signal each time the counted value reaches the predetermined number.

9. The circuit for regulating sensitivity an output of a squelch circuit according to claim 5, further comprising:

a counter to count a predetermined number repeatedly, the counter outputting the clear command signal each time the counted value reaches the predetermined number.

10. The circuit for regulating sensitivity an output of a squelch circuit according to claim 4, further comprising:

a register storing a plurality of sensitive regulating values having different values in steps, wherein the sensitivity of the squelch circuit is regulated by reading out a different one of the sensitivity regulating values from the register each time the output discriminating circuit identifies that the output of the squelch circuit is in the 'Noisy' state.

11. The circuit for regulating sensitivity an output of a squelch circuit according to claim 5, further comprising:

a register storing a plurality of sensitive regulating values having different values in steps, wherein the sensitivity of the squelch circuit is regulated by reading out a different one of the sensitivity regulating values from the register each time the output discriminating circuit identifies that the output of the squelch circuit is in the 'Noisy' state.

* * * * *